US007623405B2

(12) United States Patent
Lysinger et al.

(10) Patent No.: US 7,623,405 B2
(45) Date of Patent: Nov. 24, 2009

(54) SRAM WITH SWITCHABLE POWER SUPPLY SETS OF VOLTAGES

(75) Inventors: Mark A. Lysinger, Carrollton, TX (US); David C. McClure, Carrollton, TX (US); François Jacquet, Froges (FR)

(73) Assignees: STMicroelectronics, Inc., Carrollton, TX (US); STMicroelectronics S.A. (FR)

( * ) Notice: Subject to any disclaimer, the term of this patent is extended or adjusted under 35 U.S.C. 154(b) by 86 days.

(21) Appl. No.: 12/030,463

(22) Filed: Feb. 13, 2008

(65) Prior Publication Data

US 2008/0198679 A1    Aug. 21, 2008

Related U.S. Application Data

(60) Provisional application No. 60/901,370, filed on Feb. 15, 2007.

(51) Int. Cl.
*G11C 5/14* (2006.01)
(52) U.S. Cl. .................. 365/229; 365/154; 365/189.02; 365/189.07
(58) Field of Classification Search .................. 365/154, 365/156, 189.02, 189.07, 226, 227, 229
See application file for complete search history.

(56) References Cited

U.S. PATENT DOCUMENTS

| | | | |
|---|---|---|---|
| 5,570,313 A | 10/1996 | Masson et al. | |
| 5,726,562 A | 3/1998 | Mizuno et al. | |

(Continued)

OTHER PUBLICATIONS

Extended European Search Report, EP 08 15 1480.4, dated May 2, 2008.

(Continued)

*Primary Examiner*—Tuan T Nguyen
*Assistant Examiner*—Tha-O Bui
(74) *Attorney, Agent, or Firm*—Lisa K. Jorgenson; Andre M. Szuwalski

(57) ABSTRACT

A circuit includes a memory cell having a high voltage supply node and a low voltage supply node. Power multiplexing circuitry is included to selectively apply one of a first set of voltages and a second set of voltages to the high and low voltage supply nodes of the cell in dependence upon a current operational mode of the cell. If the cell is in active read or write mode, then the multiplexing circuitry selectively applies the first set of voltages to the high and low voltage supply nodes. Conversely, if the cell is in standby no-read or no-write mode, then the multiplexing circuitry selectively applies the second set of voltages to the high and low voltage supply nodes. The second set of voltages are offset from the first set of voltages. More particularly, a low voltage in the second set of voltages is higher than a low voltage in the first set of voltages, and wherein a high voltage in the second set of voltages is less than a high voltage in the first set of voltages. The cell can be a member of an array of cells, in which case the selective application of voltages applies to the array depending on the active/standby mode of the array. The array can include a block or section within an overall memory device including many blocks or sections, in which case the selective application of voltages applies to individual blocks/sections depending on the active/standby mode of the block/section itself.

25 Claims, 4 Drawing Sheets

U.S. PATENT DOCUMENTS

| | | |
|---|---|---|
| 6,838,926 B2 | 1/2005 | Jung et al. |
| 6,891,745 B2 * | 5/2005 | Liaw .................... 365/154 |
| 6,999,338 B1 * | 2/2006 | Hirabayashi ............. 365/154 |
| 7,112,895 B2 | 9/2006 | Hokenmaier |
| 7,254,085 B2 * | 8/2007 | Hirabayashi ............. 365/154 |
| 7,307,907 B2 * | 12/2007 | Houston .................. 365/229 |
| 7,372,746 B2 * | 5/2008 | Kim ................... 365/189.06 |
| 7,382,674 B2 * | 6/2008 | Hirabayashi ............. 365/226 |
| 2001/0038552 A1 | 11/2001 | Ishimaru |
| 2003/0076705 A1 | 4/2003 | Yamaoka et al. |
| 2004/0125681 A1 | 7/2004 | Yamaoka et al. |
| 2005/0117379 A1 | 6/2005 | Kang |
| 2005/0146948 A1 | 7/2005 | Hose et al. |
| 2008/0198678 A1 * | 8/2008 | McClure et al. ........... 365/226 |
| 2008/0211513 A1 * | 9/2008 | Lysinger et al. .......... 324/550 |

OTHER PUBLICATIONS

K. Kumagai, A Novel Powering-down Scheme for Low Vt CMOS Circuits, IEEE, Symposium on VLSI Circuits Digest of Technical Papers, 1998, pp. 44-45.

* cited by examiner

SRAM WITH SWITCHABLE POWER SUPPLY SETS OF VOLTAGES

PRIORITY CLAIM

The present application claims the benefit of U.S. Provisional Application for Patent Ser. No. 60/901,370 filed Feb. 15, 2007, the disclosure of which is hereby incorporated by reference.

BACKGROUND OF THE INVENTION

1. Technical Field of the Invention

The present invention relates to power supplies for integrated circuit memories and, more particularly, to a memory receiving switchable power supply sets of voltages depending on active and standby mode operation.

2. Description of Related Art

Reference is made to FIG. 1 which is a schematic diagram of a standard six transistor static random access memory (SRAM) cell 10. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (pass gate) transistors 20 and 22 whose gate terminals are controlled by a word line (WL). Transistor 20 is connected between the true node 16 and a true bit line (BLT). Transistor 22 is connected between the complement node 18 and a complement bit line (BLC). The source terminals of the p-channel transistors in each inverter 12 and 14 are coupled to receive a high voltage at a high voltage $V_H$ node, while the source terminals of the n-channel transistors in each inverter 12 and 14 are coupled to receive a low voltage at a low voltage $V_L$ node. The high voltage $V_H$ and the low voltage $V_L$ comprise a power supply set of voltages for the cell 10. Conventionally, the high voltage $V_H$ is a positive voltage (for example, 1.5V) and the low voltage $V_L$ is a ground voltage (for example, 0V). In an integrated circuit including the SRAM cell 10, this power supply set of voltages may be received at pins of the integrated circuit, or may instead be generated on chip by a voltage converter circuit which receives some other set of voltages received from the pins of the chip. The power supply set of voltages $V_H$ and $V_L$ are conventionally applied to the SRAM cell 10 at all times that the cell/integrated circuit is operational.

Reference is now made to FIG. 2 which is a block diagram of a static random access memory (SRAM) array 30. The array 30 includes a plurality of SRAM cells 10 arranged in an matrix format. The number of cells 10 included in the array 30 can widely vary depending on the circuit designer's needs. The high voltage $V_H$ and the low voltage $V_L$ of the power supply set of voltages is applied to the array 30 and distributed over the array in a manner well known to those skilled in the art to the individual ones of the included cells 10 (for application to the source terminals of the p-channel and n-channel transistors as shown in FIG. 1).

Reference is now made to FIG. 3 which is a block diagram of a static random access memory (SRAM) array 40. The array 40 is comprised of a plurality of memory blocks 42 arranged in a matrix format. The number of blocks 42 included in the array 40 can widely vary depending on the circuit designer's needs. Each block 42 includes a plurality of SRAM cells 10 also arranged in a matrix format. The number of cells 10 included in the block 42 can widely vary depending on the circuit designer's needs. The high voltage $V_H$ and the low voltage $V_L$ of the power supply set of voltages is applied to the array 40 and distributed over the array by a power distribution grid in a manner well known to those skilled in the art to each of the blocks 42. Power is then passed on to the individual ones of the included cells 10 within each block 42 (for application to the source terminals of the p-channel and n-channel transistors as shown in FIG. 1).

As the integrated circuit (IC) industry shifts from high performance and often high power consumption devices to more energy efficient devices using state of the art fabrication processes, new low power design techniques are required. Specifically, in some battery powered devices maximizing speed is a secondary consideration to minimizing power consumption.

To retain data in a static random access memory (SRAM), power must be applied to the cell. If power is removed from the cell then the data stored therein is lost. It is likely that for a majority of the time that power is being applied to the memory cell, that power is being consumed in a standby or wait mode between instances of a read or write operation (active read/write mode). There is a need in the art to consider ways to reduce the power consumed while an SRAM cell is in standby waiting to be written or read. This is especially of concern when the memory is powered from a battery power source, and when the array becomes very large in size.

Wafer fabrication processes are developed to produce integrated circuits that have the best balance of electronic properties. The goal is to have high performance at the lowest possible power consumption. Some applications require the balance to be shifted more toward higher performance, while other applications require shifting balance toward lower power consumption. Other parameters known in the art are considered by the circuit designer to determine the characteristics of an integrated circuit.

The transistors used in the memory device are engineered by wafer fabrication process engineers to provide the best performance at the lowest power consumption. Newer state of the art processes seek to improve these characteristics over previous processes. The circuit designer also uses techniques to optimize this performance.

A given integrated circuit process typically has an optimal supply set of voltages (high voltage and low voltage) that powers the transistors. This voltage set parameter gives the best performance under most circumstances, but not necessarily in all circumstances. For an SRAM, this voltage set may be fine for the period of time during which the memory is being written or read. When the memory is at rest waiting for the next access (standby mode), however, this voltage may not be optimum.

For applications that run on a battery, power consumption is the most critical specification. For circuits used in these applications design efforts are primarily focused on using circuits that consume the minimal amount of power.

It is known in the art that integrated circuit transistors have non-ideal characteristics that draw power even when not active. These "leakage" currents can add up to be a serious problem in a circuit, such as a memory array, which includes a large number of transistors. Generally, the higher the high voltage of the voltage set, the higher the potential leakage current which can occur. A need accordingly exists to address this leakage current problem and preferably reduce leakage current across a memory array.

SUMMARY

In an embodiment, a circuit comprises a memory cell having a high voltage supply node and a low voltage supply node.

A first power supply multiplexing circuitry has a first input for receiving a first high supply voltage and a second input for receiving a second high supply voltage that is less than the first high supply voltage. The first power supply multiplexing circuitry is responsive to a first control signal, and applies the first high supply voltage to the high voltage supply node if the first control signal has a first state, or applies the second high supply voltage to the high voltage supply node if the first control signal has a second state. A second power supply multiplexing circuitry has a first input for receiving a first low supply voltage and a second input for receiving a second low supply voltage that is greater than the first low supply voltage. The second power supply multiplexing circuitry is responsive to a second control signal, and applies the first low supply voltage to the low voltage supply node if the second control signal has a first state, or applies the second low supply voltage to the low voltage supply node if the second control signal has a second state.

In another embodiment, a circuit comprises: an array of memory cells, the array having a high voltage supply node and a low voltage supply node; and circuitry to selectively apply one of a first set of voltages and a second set of voltages to the high and low voltage supply nodes of the array in dependence upon a current operational mode of the array. If the array is in active read or write mode then the circuitry selectively applies the first set of voltages to the high and low voltage supply nodes. However, if the array is in standby no-read or no-write mode then the circuitry selectively applies the second set of voltages to the high and low voltage supply nodes.

In another embodiment, a circuit comprises: an array of memory cells, the array being divided into a plurality of memory blocks, each memory block having a high voltage supply node and a low voltage supply node for the cells within the memory block; an address decoder circuit which decodes an address in the array, the address decoder circuit generating a mode control signal for each memory block in the array, the mode control signal having an active read or write mode state when cells in the memory block are being addressed and the mode control signal having a standby no-read or no-write state when cells in the memory block are not being addressed; and circuitry associated with each memory block which operates responsive an associated one of the mode control signals to selectively apply a first set of voltages to the high and low voltage supply nodes of the memory block if the mode control signal is in the active read or write mode state and apply a second set of voltages to the high and low voltage supply nodes of the memory block if the mode control signal is in the standby no-read or no-write state.

In another embodiment, a method comprises: receiving power for a memory cell at a high voltage supply node and a low voltage supply node; first selectively applying a first set of voltages to the high and low voltage supply nodes of the cell if the cell is currently in an active read or write operational mode; and second selectively applying a second set of voltages to the high and low voltage supply nodes of the cell if the cell is currently in a standby no-read or no-write operational mode.

In another embodiment, a method comprises: receiving power for an array of memory cells at a high voltage supply node and a low voltage supply node; first selectively applying a first set of voltages to the high and low voltage supply nodes of the array of memory cells if any cells in the array of memory cells are currently being addressed for read or write operations; and second selectively applying a second set of voltages to the high and low voltage supply nodes of the array of memory cells if none of the cells in the array of memory cells are currently being addressed for read or write operations.

BRIEF DESCRIPTION OF THE DRAWINGS

Other objectives, features and advantages of the invention will become apparent upon reading the following description, presented solely by way of non-limiting example and with reference to the appended drawings, in which.

DETAILED DESCRIPTION OF THE DRAWINGS

Figure 4:
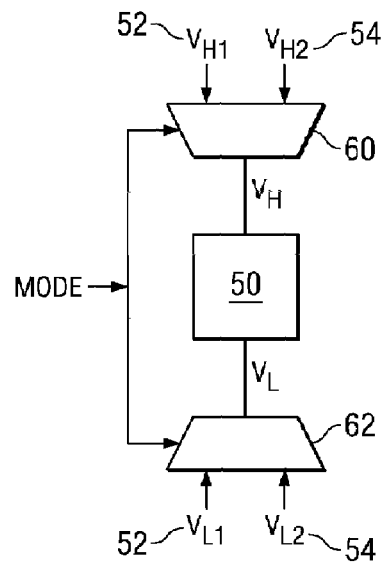
FIG. 4 is a block diagram showing a static random access memory (SRAM) cell powered from switched power supply sets of voltages.

Reference is now made to FIG. 4 which is a block diagram showing a static random access memory (SRAM) cell 50 powered from switched power supply sets of voltages (each set including a high voltage and a low voltage). The power supply sets of voltages include a first power supply set of voltages 52 and a second power supply set of voltages 54. Each power supply set of voltages 52 and 54 is associated with a different mode of operation for the cell 50. For example, the first power supply set of voltages 52 is associated with an active mode of the cell 50, such as when reading from or writing to the cell. The second power supply set of voltages 54, on the other hand, is associated with a standby mode of the cell 50, such as when there is no reading from or writing to the cell being performed. Although two power supply sets of voltages are shown and will be discussed herein, it will be understood that more than two power supply sets of voltages could be used, with each included power supply set of voltages being associated with a different operating mode of the cell 50.

Figure 1:
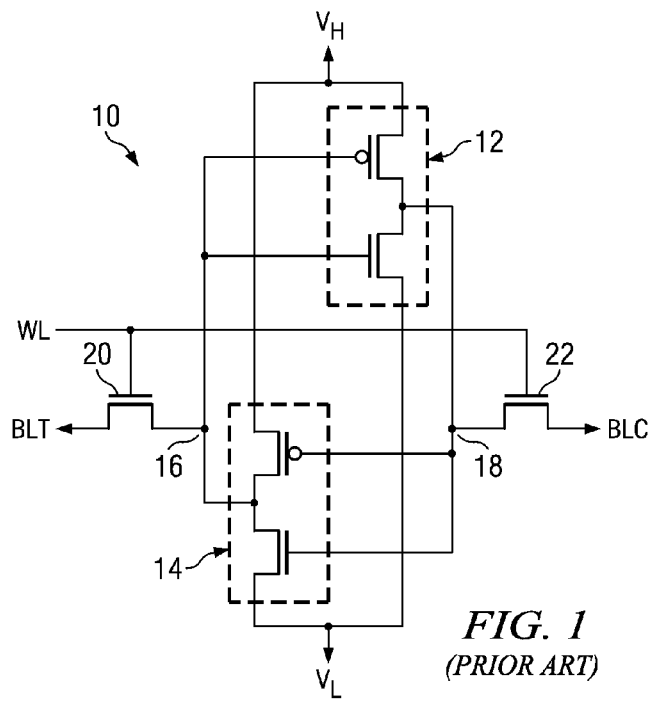
FIG. 1 is a schematic diagram of a standard six transistor static random access memory (SRAM) cell.
Figure 2:
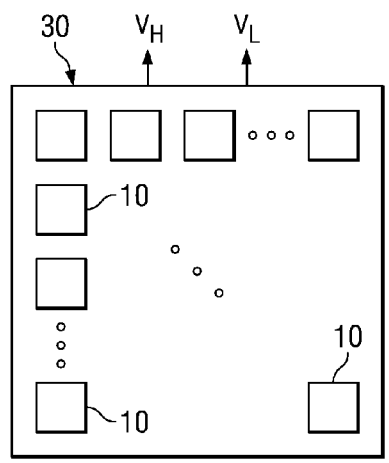
FIG. 2 shows a block diagram of a static random access memory (SRAM) array.
Figure 3:
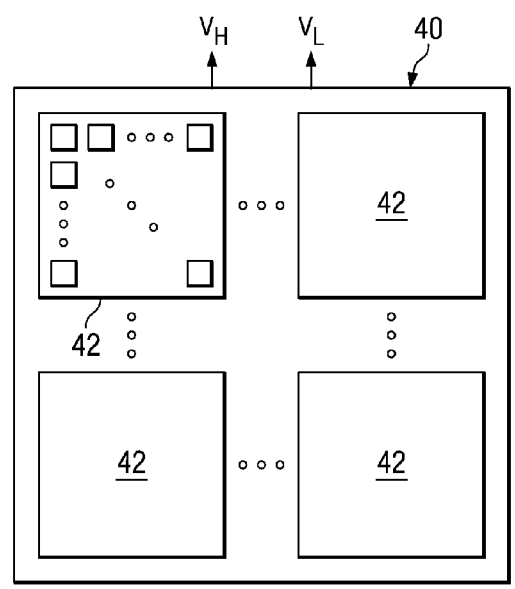
FIG. 3 shows a block diagram of a static random access memory (SRAM) array.

The SRAM cell 50 may have a standard six transistor static random access memory cell architecture as is shown in FIG. 1. The cell 50 can alternatively have the architecture shown in FIG. 10 (described below). Although described in the context of an SRAM cell 50, the switched power supply sets of voltages could instead be advantageously used in connection with the mode switched powering of other types of integrated circuit memory cells (for example, content addressable memory) including transistors which have leakage concerns. Thus, the illustration of an SRAM cell 50 is by example only.

In a low power SRAM application, such as when the SRAM cell 50 is used within a memory array in an integrated circuit device which is battery powered, the power supply sets of voltages are quite low. For example, the first power supply set of voltages 52 may include a high voltage $V_{H1}$ of 1.2V-1.5V and a low voltage $V_{L1}$ of 0V. The second power supply set of voltages 54, on the other hand, may include a high voltage $V_{H2}$ which is offset less than high voltage $V_{H1}$ and a low voltage $V_{L2}$ which is offset greater than low voltage $V_{L1}$. The voltage offsets, both high and low, used for the second power supply set of voltages 54 with respect to the first power supply set of voltages 52 are selected by the circuit designer in order to help address leakage current concerns associated with the operation of the circuit (more specifically, the cell) when in standby (no-read or no-write) mode. These voltage offsets may typically be in the range of 200-400 mV. In a particular, but not limiting, example, the second power supply set of voltages 54 may include a high voltage $V_{H2}$ of 0.9V-1.1V and a low voltage $V_{L2}$ of 0.3V-0.4V.

The first and second power supply sets of voltages 52 and 54 are selectively multiplexed for application to the high voltage $V_H$ node and low voltage $V_L$ node of the memory cell 50. This is accomplished by a first multiplexing circuit 60 associated with the high voltage $V_H$ node and a second multiplexing circuit 62 associated with the low voltage $V_L$ node. Operation of the first and second multiplexing circuits 60 and 62 is controlled responsive to a control signal MODE which is indicative of whether the memory cell 50 is in active mode (such as when reading from or writing to the cell) or is in standby mode (such as when there is no reading from or writing to the cell being performed). Active versus standby mode at the cell level may be determined by whether the word line WL is being asserted, whether a sense amplifier on the bit lines BLT/BLC is enabled, or some combination of the two.

If the control signal MODE=active, then the first and second multiplexing circuits 60 and 62 operate responsive thereto to apply the first power supply set of voltage 52 (high voltage $V_{H1}$ and low voltage $V_{L1}$) to the high voltage $V_H$ node and low voltage $V_L$ node of the memory cell 50. Conversely, if the control signal MODE=standby, then the first and second multiplexing circuits 60 and 62 operate responsive thereto to apply the second power supply set of voltages 54 (high voltage $V_{H2}$ and low voltage $V_{L2}$) to the high voltage $V_H$ node and low voltage $V_L$ node of the memory cell 50. The reduction in the voltage potential difference between the high voltage $V_H$ node and low voltage $V_L$ node of the memory cell 50 when the high voltage $V_{H2}$ and low voltage $V_{L2}$ of the second set of voltages are instead applied serves to address concerns over transistor leakage because the cells leak, if at all, at a far reduced rate than if the high voltage $V_{H1}$ and low voltage $V_{L1}$ of the first set of voltages were being applied (such as is needed when in active mode).

Figure 5A:
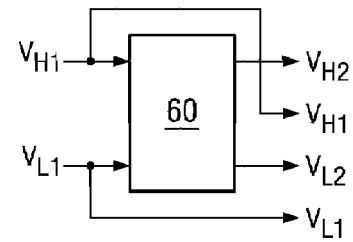
FIGS. 5A and 5B illustrate options for generating multiple power supply sets of voltages.
Figure 5B:
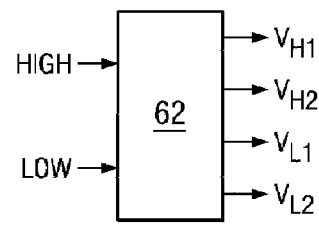

With reference now to FIG. 5A, the second power supply set of voltages 54 can be generated from the first power supply set of voltages 52 using an appropriate voltage generator circuit 60. This circuit 60 can take on any one of a number of possible configurations known to those skilled in the art. The first power supply set of voltages 52 may be received at pins of the integrated circuit. Conversely, as illustrated in FIG. 5B, the first power supply set of voltages 52 and the second power supply set of voltages 54 can be generated from a global set of voltages using a voltage generator circuit 62. This circuit 62 can take on any one of a number of possible configurations known to those skilled in the art. The global set of voltages may be received at pins of the integrated circuit. Alternatively, the first power supply set of voltages 52 and the second power supply set of voltages 54 may be separately received at pins of the integrated circuit. An example of a circuit 60 or 62 of the type for use in generating the sets of voltages is shown in commonly-assigned co-pending application for patent Ser. No. 12/029,366, filed Feb. 11, 2008, entitled PROGRAMMABLE SRAM SOURCE BIAS SCHEME FOR USE WITH SWITCHABLE SRAM POWER SUPPLY SETS OF VOLTAGES, by David McClure, Mark Lysinger, Mehdi Zamanian, Francois Jacquet and Philippe Roche, the disclosure of which is hereby incorporated by reference.

Figure 6:
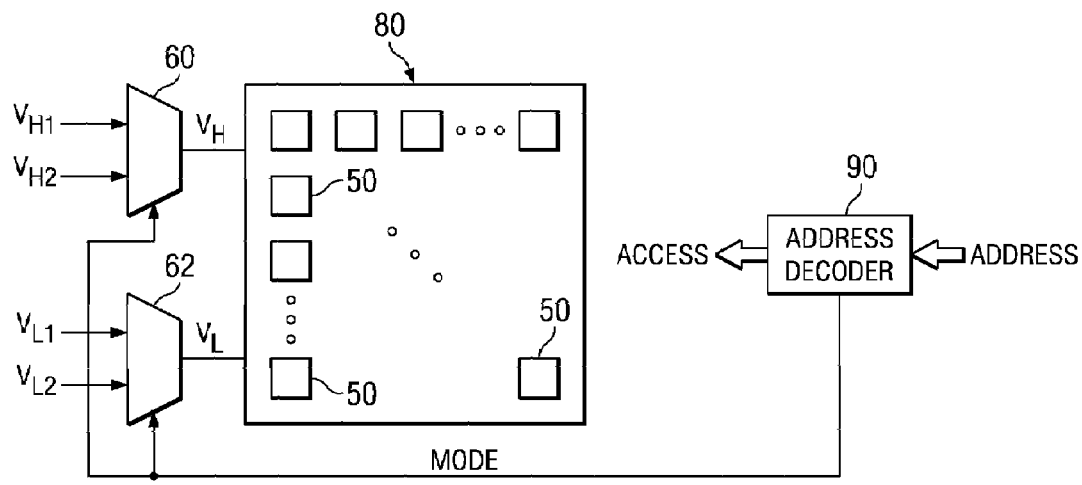
FIG. 6 illustrates a small size memory array powered from switched power supply sets of voltages.

With reference to FIG. 6, for a memory array 80 having a small size, the selective multiplexing of the first and second power supply sets of voltages 52 and 54 for application to the high voltage $V_H$ node and low voltage $V_L$ node can be implemented in a manner wherein the selective switching between the sets of voltages is applicable to each included memory cell 50 in the array 80. Thus, when the address decoder 90 functions to decode an address and access the array 80 (through word line and column selection as known in the art), the MODE signal is set to "active" and the multiplexers 60 and 62 function responsive thereto to apply the first power supply set of voltages 52 to the high voltage $V_H$ node and low voltage $V_L$ node. All included cells 50 in the array 80 will receive the first set of voltages 52 during the active mode. Conversely, when the address decoder is not functioning to decode an address for purposes of accessing the array 80 (in other words, there is no read/write access being performed at that time), the MODE signal is set to "standby" and the multiplexers 60 and 62 function responsive thereto to apply the second power supply set of voltages 54 to the high voltage $V_H$ node and low voltage $V_L$ node. As the memory array grows in size, however, this global switching between the first and second sets of voltages over the array of memory cells 50 is not a practical solution.

Figure 7:
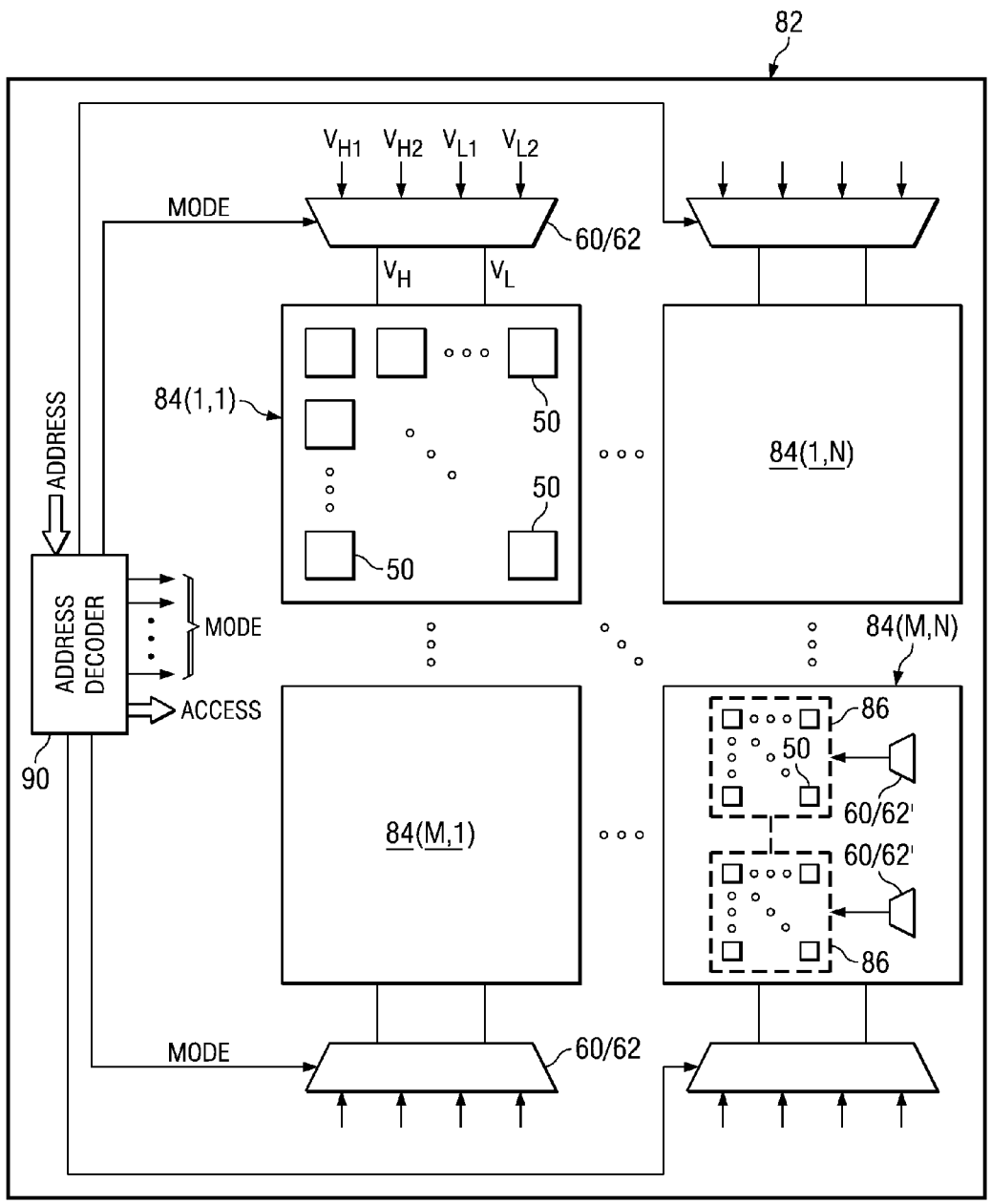
FIG. 7 illustrates a larger size memory array powered from switched power supply sets of voltages.

Referring now to FIG. 7, in a larger-sized memory array 82, the array can be divided up into a plurality of memory blocks 84 which are arranged in a matrix format (such as N×M). The number of blocks 84 included in the array 82 can widely vary depending on the circuit designer's needs. Each block 82 includes a plurality of SRAM cells 50 also arranged in a matrix format. The number of cells 50 included in the block 44 can widely vary depending on the circuit designer's needs. The selection of the number of blocks 84 and the number of cells 50 in each block, as well as the format of the matrix layout for blocks 84 and cells 50 therein, is made by the designer based on the use of the memory 82 in a given application.

An address decoder 90 decodes the address being applied to the memory array 82 and identifies the block 84 containing the cells 50 associated with that address. Responsive thereto, the decoder 90 accesses the array (for example, through word line and column selection as known in the art) and sets that MODE signal for that particular identified block to "active," with all other MODE signals (for the blocks containing non-addressed cells 50) being set to "standby." The multiplexing circuit(s) 60 and 62 which respond to a MODE=active signal then function to switch to the first power supply set of voltages 52 for application to the high voltage $V_H$ node and low voltage $V_L$ node of each included memory cell 50 in those one (or perhaps more) identified block(s) 84 containing addressed cells 50. Conversely, the multiplexing circuit(s) 60 and 62 which respond to a MODE=standby signal then function to switch to the second power supply set of voltages 54 for application to the high voltage $V_H$ node and low voltage $V_L$ node of each included memory cell 50 in those one (or perhaps more) block(s) 84 containing non-addressed cells 50.

In a specific example, assume the address being decoded applies to a row of cells 50 in block 84(1,1) of the N×M array 82. The multiplexing circuits 60 and 62 associated with block 84(1,1) respond to the MODE=active signal. All other blocks 84 in the array 82, however, respond to the MODE=standby signal. Block 84(1,1), through its multiplexing circuits 60 and 62, receives the first power supply set of voltages 52 at the high voltage $V_H$ node and low voltage $V_L$ node. Power distribution circuitry within block 84(1,1), as known to those skilled in the art, applies the first power supply set of voltages 52 received from the multiplexers to each cell 50 in that block (for example, by application to the source terminals of the CMOS inverter transistors in the SRAM cell 10 shown in FIG. 1).

Further to the foregoing example, the other blocks 84 do not include addressed cells 50. Their respective multiplexing circuits 60 and 62 each respond to the MODE=standby signal, and apply the second power supply set of voltages 54 to the high voltage $V_H$ node and low voltage $V_L$ node. Power distribution circuitry within each block 84, as known to those skilled in the art, applies the second power supply set of voltages 54 received from the multiplexers to each cell 50 in those blocks (for example, by application to the source terminals of the CMOS inverter transistors in the SRAM cell 10 shown in FIG. 1).

With the application of the second power supply set of voltages 54 to all non-addressed blocks 84 in the array, there will be a reduction in leakage current in the cells 50 of those blocks 84, and thus there will also be a reduction in standby mode power loss.

The hierarchical architecture shown in FIG. 7 with multiple blocks 84 within array 82 is by way of example only. Additional layers in the hierarchy can be used. For example, each block 84 can be divided into multiple sections arranged in a matrix format (this is illustrated for exemplary purposes in block 84(M,N) which includes multiple sections 86). The number of sections 86 included in each block 84 can widely vary depending on the circuit designer's needs. Each section 86 would include a plurality of SRAM cells 50 also arranged in an matrix format. The number of cells 50 included in each section can widely vary depending on the circuit designer's needs. With this architecture, the multiplexing circuits 60 and 62 would be associated at the section level (as indicated at reference 60/62'), and the decoder 90 would generate appropriate MODE signals whose value (active or standby) would depend on which section included the addressed cells 50 which are being accessed.

As a practical example, a section could comprise 64 rows× 64 columns of cells 50 (i.e., 64×64 cells). A block 84 could comprise 1×32 sections. The array 82 could comprise 32×2 blocks 84 (thus providing a total 8 Mbit array). The circuitry described above accordingly allows two power supply sets of voltages to be selectively multiplexed onto the memory cell power grid of a memory array. This approach places both sets of voltages throughout the array for selective use, and switches the power supply received between those sets of voltages on a much smaller scale of, for example, a section 86 of 64 rows by 64 columns or a block 84 of multiple sections 86. The multiplexers for each section/block include transistors that effectively multiplex the high and low power connection between a first set of voltages providing full voltage values at a high voltage (1.5V) and a low voltage (0V) and a second set of voltages which are offset providing a high voltage (1.1V) and a low voltage (0.4V). Voltage generation circuits 60 or 62 supply at least the second set of voltage (the offset voltages). Tweaking of the voltage offset amounts can be accomplished through trimming circuitry within the generator 60 or 62 on chip.

While in normal operation and when the array is waiting for access (read/write) the offset voltages from the second set of voltages are connected to all sections/blocks to effectuate a reduction in leakage current. When a section is awakened for writing or reading, the offset voltages are disconnected from the section/block that has been addressed and the full voltages of the first set of voltages are applied thereto. The size of the section/block is chosen based on two design considerations. The capacitance of the section/block power grid must be small enough such that switching can be done in a reasonable amount of time. Secondly, the overhead area for the switches used for multiplexing should not be too large relative to the memory cell array area.

Figure 8:
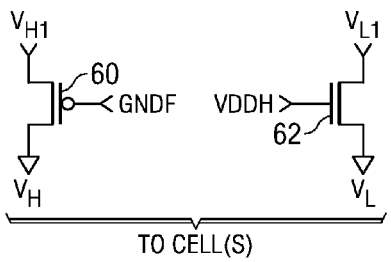
FIG. 8 is a schematic diagram of transistors within a multiplexing circuit which selectively connects voltages from a first power supply set of voltages.

Reference is now made to FIG. 8 which shows a schematic diagram of the transistors within the multiplexers 60 and 62 which connect the full voltages of the first power supply set of voltages comprising high voltage $V_{H1}$ and low voltage $V_{L1}$ to the high voltage $V_H$ node and low voltage $V_L$ node of a section, block or array for application to cells. In the section implementation, for example, there is one set of each of these FIG. 8 transistors on each column for each section of the full array. The size and the number of these transistors are selected for area limitations and to provide the proper recovery time when an access is to take place. The p-channel transistor gates and n-channel transistor gates are controlled by complimentary signals GNDF and VDDH, respectively, which are derived from the MODE signal (in a manner to be discussed). These GNDF and VDDH signals are in a first complementary mode when the address decoder 90 points to the array section 86 to be accessed (i.e., when MODE=active).

Figure 9:
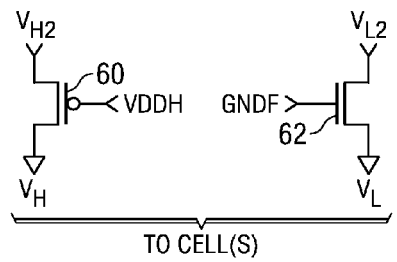
FIG. 9 is a schematic diagram of transistors within a multiplexing circuit which selectively connects voltages from a second power supply set of voltages.

Reference is now made to FIG. 9 which shows a schematic diagram of the transistors within the multiplexers 60 and 62 which connect the offset voltages of the second power supply set of voltages comprising high voltage $V_{H2}$ and low voltage $V_{L2}$ to the high voltage $V_H$ node and low voltage $V_L$ node of a section, block or array for application to cells. The transistors here are placed on the row pitch rather than on the column pitch. The p-channel transistor gates and n-channel transistor gates are controlled by complimentary signals VDDH and GNDF, respectively, which are derived from the MODE signal. These VDDH and GNDF signals are a second complementary mode when the address decoder 90 is not pointing to the array section (i.e., when MODE=standby).

It will be noted that the gate control signals in FIGS. 8 and 9 are swapped with respect to each other. The result is that the high voltage $V_H$ node and low voltage $V_L$ node of a section, block or array can be connected to only one of the first and second power supply sets of voltages at any one time.

Figure 10:
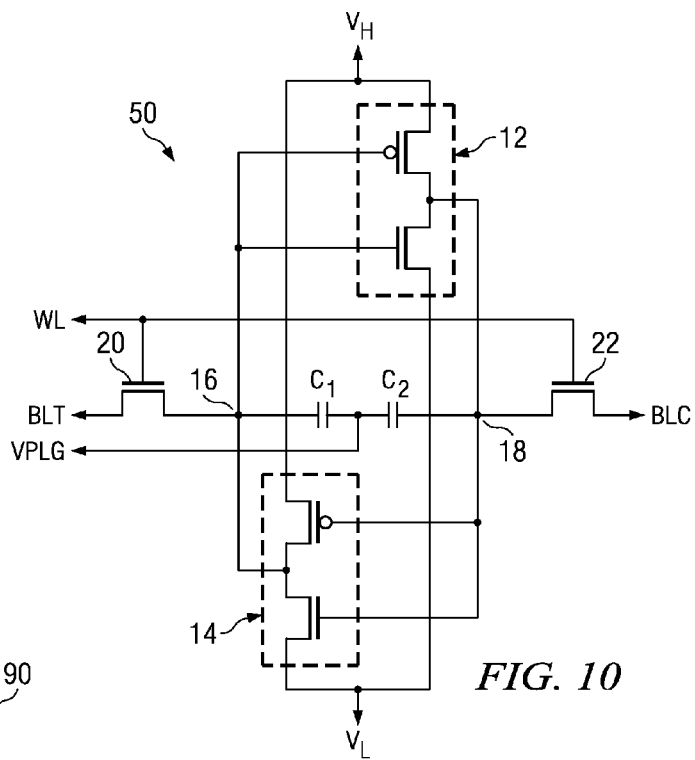
FIG. 10 is a schematic diagram of an alternative configuration six transistor static random access memory (SRAM) cell.

Reference is now made to FIG. 10 wherein there is shown a schematic diagram of an alternative configuration six transistor static random access memory (SRAM) cell which could be used for the cell 50 as described above. This cell has a schematic configuration like that shown in FIG. 1. Like reference numbers refer to like components and connections. This cell, however, adds a pair of capacitors C1 and C2 which are connected in series between the true node 16 and complement node 18. At the node where the capacitors C1 and C2 are connected in series, a global plate voltage VPLG is applied. The use of this capacitor configuration and VPLG voltage improves storage robustness of the memory cell. The VPLG voltage may, for example, be set at halfway between the supply voltages (for example, 0.6V-0.7V or about halfway between the high voltage $V_{H2}$ and low voltage $V_{L2}$) for an implementation where the active mode set of voltages applied to the high voltage $V_H$ node and low voltage $V_L$ node are about 1.2V-1.5V and 0V, respectively. Any suitable voltage generator circuit can be used to generate the VPLG voltage (for example, from the 1.2V-1.5V high voltage $V_H$.

Figure 11:
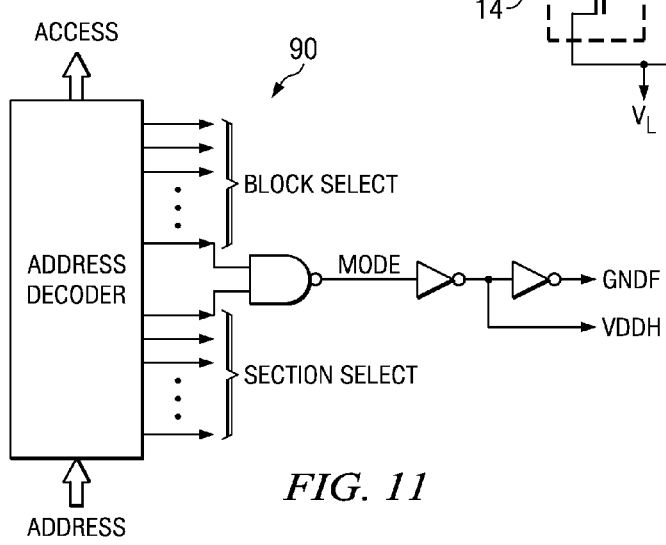
FIG. 11 is a block diagram of exemplary circuitry for controlling the multiplexing circuitry of FIGS. 8 and 9.

With reference to FIG. 11, there is shown a block diagram of circuitry for controlling the multiplexing circuitry of FIGS. 8 and 9. This particular illustration is applicable to the situation, as shown in connection with block 84(M,N) in FIG. 7 where the array 82 includes multiple blocks 84 and each block includes multiple sections 86, and each section includes multiple cells 50. Switched power supply sets of voltages are applied in this instance at the section level of the architectural hierarchy. The address decoder responds to a received address for accessing cell(s) 50 of the array by generating appropriate array access signals (for example, through word line and column selection as known in the art). The decoder further includes a plurality of block select outputs associated with the plurality of blocks 84 in the array 82, and a plurality of section select outputs associated with the plurality of sections 86. Logic circuitry, for example comprising a NAND gate, logically combines one block select output (for the block 84 within which the addressed cell(s) are located) and one section select output (for the section 86 within which the addressed cell(s) are located) to generate the MODE signal at the section level of the hierarchy. This MODE signal is in an "active" state when the addressed cell(s) are in the associated block 84 and one particular section 86 within that block. Otherwise, MODE=standby. A set of inverters buffer the MODE signal and generate complementary multiplexer control signals GNDF and VDDH which are applied to the circuitry of FIGS. 8 and 9 in order to make a selection, at the section 86 level, between application of the first set of voltages to the high voltage $V_H$ node and low voltage $V_L$ node (when MODE=active) or application of the second set of voltages to the high voltage $V_H$ node and low voltage $V_L$ node (when MODE=standby). The illustrated logic circuitry is exemplary in nature only, it being understood that one skilled in the art can design a number of possible circuits for responding to received address for memory array access and generate, at a section level of the hierarchy, an appropriate MODE signal representative of whether the address is pertinent to a given section (active) or not (standby).

In the event the architectural hierarchy of the array 82 goes down only to the block 84 level, it will be recognized that the plurality of block select outputs would comprise individual MODE signals. A two inverter buffer circuit as shown in FIG. 11 could then be used to buffer the MODE signal and generate complementary multiplexer control signals GNDF and VDDH which are applied to the circuitry of FIGS. 8 and 9 in order to make a selection, at the block 84 level of the hierarchy, between application of the first set of voltages to the high voltage $V_H$ node and low voltage $V_L$ node (when MODE=active) or application of the second set of voltages to the high voltage $V_H$ node and low voltage $V_L$ node (when MODE=standby).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
   a memory cell having a high voltage supply node and a low voltage supply node;
   first power supply multiplexing circuitry having a first input for receiving a first high supply voltage and a second input for receiving a second high supply voltage that is less than the first high supply voltage, the first power supply multiplexing circuitry being responsive to a first control signal, wherein the first power supply multiplexing circuitry applies the first high supply voltage to the high voltage supply node if the first control signal has a first state, and applies the second high supply voltage to the high voltage supply node if the first control signal has a second state;
   second power supply multiplexing circuitry having a first input for receiving a first low supply voltage and a second input for receiving a second low supply voltage that is greater than the first low supply voltage, the second power supply multiplexing circuitry being responsive to a second control signal, wherein the second power supply multiplexing circuitry applies the first low supply voltage to the low voltage supply node if the second control signal has a first state, and applies the second low supply voltage to the low voltage supply node if the second control signal has a second state.

2. The circuit of claim 1 wherein the first and second control signals share common states.

3. The circuit of claim 1 wherein the second high supply voltage is less than the first high supply voltage by a few hundred millivolts and wherein the second low supply voltage is greater than the first low supply voltage by a few hundred millivolts.

4. The circuit of claim 1 wherein the circuit is an integrated circuit.

5. The circuit of claim 1 wherein the memory cell is one cell in an array of memory cells.

6. A circuit, comprising:
   an array of memory cells, the array having a high voltage supply node and a low voltage supply node;
   circuitry to selectively apply one of a first set of voltages and a second set of voltages to the high and low voltage supply nodes of the array in dependence upon an operational mode of the array;
   wherein if the array is currently in active read or write mode then the circuitry selectively applies the first set of voltages to the high and low voltage supply nodes; and
   wherein if the array is currently in standby no-read or no-write mode then the circuitry selectively applies the second set of voltages to the high and low voltage supply nodes.

7. The circuit of claim 6 wherein a low voltage in the second set of voltages is higher than a low voltage in the first set of voltages, and wherein a high voltage in the second set of voltages is less than a high voltage in the first set of voltages.

8. The circuit of claim 6 wherein the circuit is an integrated circuit.

9. The circuit of claim 6 wherein the circuitry to selectively apply comprises multiplexing circuitry comprising:
   first power supply multiplexing circuitry having a first input for receiving a first high supply voltage in the first set and a second input for receiving a second high supply voltage in the second set which is less than the first high supply voltage; and
   second power supply multiplexing circuitry having a first input for receiving a first low supply voltage in the first set and a second input for receiving a second low supply voltage in the second set which is greater than the first low supply voltage.

10. The circuit of claim 9:
wherein the first power supply multiplexing circuitry is responsive to an array operational mode signal, the first power supply multiplexing circuitry applying the first high supply voltage to the high voltage supply node if currently in the active mode, and applying the second high supply voltage to the high voltage supply node if currently in the standby mode; and
wherein the second power supply multiplexing circuitry is responsive to the array operational mode signal, the second power supply multiplexing circuitry applying the first low supply voltage to the low voltage supply node if currently in the active mode, and applying the second low supply voltage to the low voltage supply node if currently in the standby mode.

11. The circuit of claim 6 wherein the circuit is an integrated circuit memory including a plurality of memory blocks, each block including the array of memory cells and circuitry to selectively apply, further comprising:
an address decoder circuit which decodes an address in memory and selects one of the blocks associated with that decoded address, the address decoder circuit generating a mode control signal for each block, the mode control signal for the selected block having an active read or write mode state and the mode control signal for non-selected blocks having a standby no-read or no-write state;
wherein the circuitry to selectively apply for each block is responsive to the mode control signal by applying the first set of voltages to the high and low voltage supply nodes if in the active read or write mode state and applying the second set of voltages to the high and low voltage supply nodes if in the standby no-read or no-write state.

12. The circuit of claim 6, further comprising:
an address decoder circuit which decodes an address in the array, the address decoder circuit generating a mode control signal for the array, the mode control signal having an active read or write mode state when the array is being addressed and the mode control signal having a standby no-read or no-write state when the array is not being addressed;
wherein the circuitry to selectively apply is responsive to the mode control signal by applying the first set of voltages to the high and low voltage supply nodes if in the active read or write mode state and applying the second set of voltages to the high and low voltage supply nodes if in the standby no-read or no-write state.

13. A circuit, comprising:
an array of memory cells, the array being divided into a plurality of memory blocks, each memory block having a high voltage supply node and a low voltage supply node for the cells within the memory block;
an address decoder circuit which decodes an address in the array, the address decoder circuit generating a mode control signal for each memory block in the array, the mode control signal having an active read or write mode state when cells in the memory block are being addressed and the mode control signal having a standby no-read or no-write state when cells in the memory block are not being addressed;
circuitry associated with each memory block and which operates responsive to one of the mode control signals to selectively apply a first set of voltages to the high and low voltage supply nodes of the memory block if the mode control signal is in the active read or write mode state and apply a second set of voltages to the high and low voltage supply nodes of the memory block if the mode control signal is in the standby no-read or no-write state.

14. The circuit of claim 13 wherein a low voltage in the second set of voltages is higher than a low voltage in the first set of voltages, and wherein a high voltage in the second set of voltages is less than a high voltage in the first set of voltages.

15. The circuit of claim 13 wherein the circuit is an integrated circuit.

16. The circuit of claim 13 wherein the circuitry to selectively apply comprises multiplexing circuitry comprising:
first power supply multiplexing circuitry having a first input for receiving a first high supply voltage in the first set and a second input for receiving a second high supply voltage in the second set which is less than the first high supply voltage; and
second power supply multiplexing circuitry having a first input for receiving a first low supply voltage in the first set and a second input for receiving a second low supply voltage in the second set which is greater than the first low supply voltage.

17. The circuit of claim 16:
wherein the first power supply multiplexing circuitry responds to the mode control signal in the active read or write mode state by applying the first high supply voltage to the high voltage supply node, and responds to the mode control signal in the standby no-read or no-write state by applying the second high supply voltage to the high voltage supply node; and
wherein the second power supply multiplexing circuitry responds to the mode control signal in the active read or write mode state by applying the first low supply voltage to the low voltage supply node, and responds to the mode control signal in the standby no-read or no-write state by applying the second low supply voltage to the low voltage supply node.

18. A method, comprising:
receiving power for a memory cell at a high voltage supply node and a low voltage supply node;
first selectively applying a first set of voltages to the high and low voltage supply nodes of the cell if the cell is currently in an active read or write operational mode; and
second selectively applying a second set of voltages to the high and low voltage supply nodes of the cell if the cell is currently in a standby no-read or no-write operational mode.

19. The method of claim 18, further comprising decoding an address and generating a first mode control signal if the decoded address indicates that the cell is in the active read or write operational mode and generating a second mode control signal if the decoded address indicates that the cell is in the standby no-read or no-write operational mode.

20. The method of claim 19 wherein first selectively applying comprises responding to the first mode control signal and second selectively applying comprises responding to the second mode control signal.

21. The method of claim 18 wherein a low voltage in the second set of voltages is higher than a low voltage in the first set of voltages, and wherein a high voltage in the second set of voltages is less than a high voltage in the first set of voltages.

22. A method, comprising:
receiving power for an array of memory cells at a high voltage supply node and a low voltage supply node;

first selectively applying a first set of voltages to the high and low voltage supply nodes of the array of memory cells if the array is in an active read or write operational mode where any cells in the array of memory cells are currently being addressed for read or write operations; and second selectively applying a second set of voltages to the high and low voltage supply nodes of the array of memory cells if the array is in a standby no-read or no-write operational mode where none of the cells in the array of memory cells are currently being addressed for read or write operations.

23. The method of claim 22 wherein the array of memory cells is for one of many blocks of memory cells in a memory circuit, each block supporting selective application of one of the first and second set of voltages to the high and low voltage supply nodes based on whether the block is in the active operational mode or the standby operational mode.

24. The method of claim 23, further comprising decoding an address and generating a first mode control signal for the block if the decoded address indicates that at least one cell in the block is currently in the active read or write operational mode and generating a second mode control signal if the decoded address indicates that cells in the block are currently in the standby no-read or no-write operational mode.

25. The method of claim 22 wherein a low voltage in the second set of voltages is higher than a low voltage in the first set of voltages, and wherein a high voltage in the second set of voltages is less than a high voltage in the first set of voltages.

* * * * *